(12) United States Patent
Pilo et al.

(10) Patent No.: US 12,094,513 B2
(45) Date of Patent: Sep. 17, 2024

(54) POWER SUPPLY TRACKING CIRCUITRY FOR EMBEDDED MEMORIES

(71) Applicant: Synopsys, Inc., Mountain View, CA (US)

(72) Inventors: Harold Pilo, Underhill, VT (US); Shishir Kumar, Noida (IN); Anurag Garg, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 179 days.

(21) Appl. No.: 17/966,680

(22) Filed: Oct. 14, 2022

(65) Prior Publication Data

US 2023/0125268 A1  Apr. 27, 2023

Related U.S. Application Data

(60) Provisional application No. 63/272,584, filed on Oct. 27, 2021.

(51) Int. Cl.
*G11C 11/22*  (2006.01)

(52) U.S. Cl.
CPC ...... *G11C 11/2297* (2013.01); *G11C 11/2255* (2013.01); *G11C 11/2259* (2013.01)

(58) Field of Classification Search
CPC ............ G11C 11/2297; G11C 11/2255; G11C 11/2259; G11C 2207/229; G11C 5/14; G11C 8/18; G11C 11/417; G11C 7/222
USPC ........................................................ 365/226
See application file for complete search history.

(56) References Cited

U.S. PATENT DOCUMENTS

| | | | |
|---|---|---|---|
| 10,008,260 | B1 | 6/2018 | Maiti et al. |
| 10,706,916 | B1 * | 7/2020 | Pilo ...................... G11C 11/417 |
| 2003/0218915 | A1 * | 11/2003 | Isono ....................... G11C 5/14 |
| | | | 365/189.12 |
| 2012/0092063 | A1 * | 4/2012 | Chang .................... G11C 7/222 |
| | | | 327/536 |
| 2017/0243637 | A1 * | 8/2017 | Kulkarni .................. G11C 7/12 |
| 2021/0110861 | A1 * | 4/2021 | Yoshida ................. G11C 7/106 |
| 2022/0101898 | A1 * | 3/2022 | Maccarrone ......... G11C 29/022 |

FOREIGN PATENT DOCUMENTS

WO  WO-2007005906 A1 *  1/2007  ........... G11C 11/417

OTHER PUBLICATIONS

International Application No. PCT/US/2022/046622, Interanational Search Report and Written Opinion dated Feb. 13, 2023.
International Application No. PCT/US/2022/046622, Interanational Preliminary Report on Patentability dated May 10, 2024.

* cited by examiner

*Primary Examiner* — Fernando Hidalgo
(74) *Attorney, Agent, or Firm* — Patterson + Sheridan, LLP

(57) ABSTRACT

Tracking circuitry for a memory device is disclosed. The tracking circuitry includes an inverter, a level shifter, delay circuitry, and a logic gate. The inverter is configured to receive a first clock signal and generate an inverted clock signal. The level shifter is configured to receive the first clock signal and the inverted clock signal and generate a level shifted clock signal. The delay circuitry is configured to receive the level shifted clock signal and generate an inverted level shifted clock signal. The logic gate comprises a first input configured to receive the first clock signal and a second input configured to receive the inverted level shifted clock signal. The logic gate is configured to generate a second clock signal based on the first clock signal and the inverted level shifted clock signal.

20 Claims, 9 Drawing Sheets

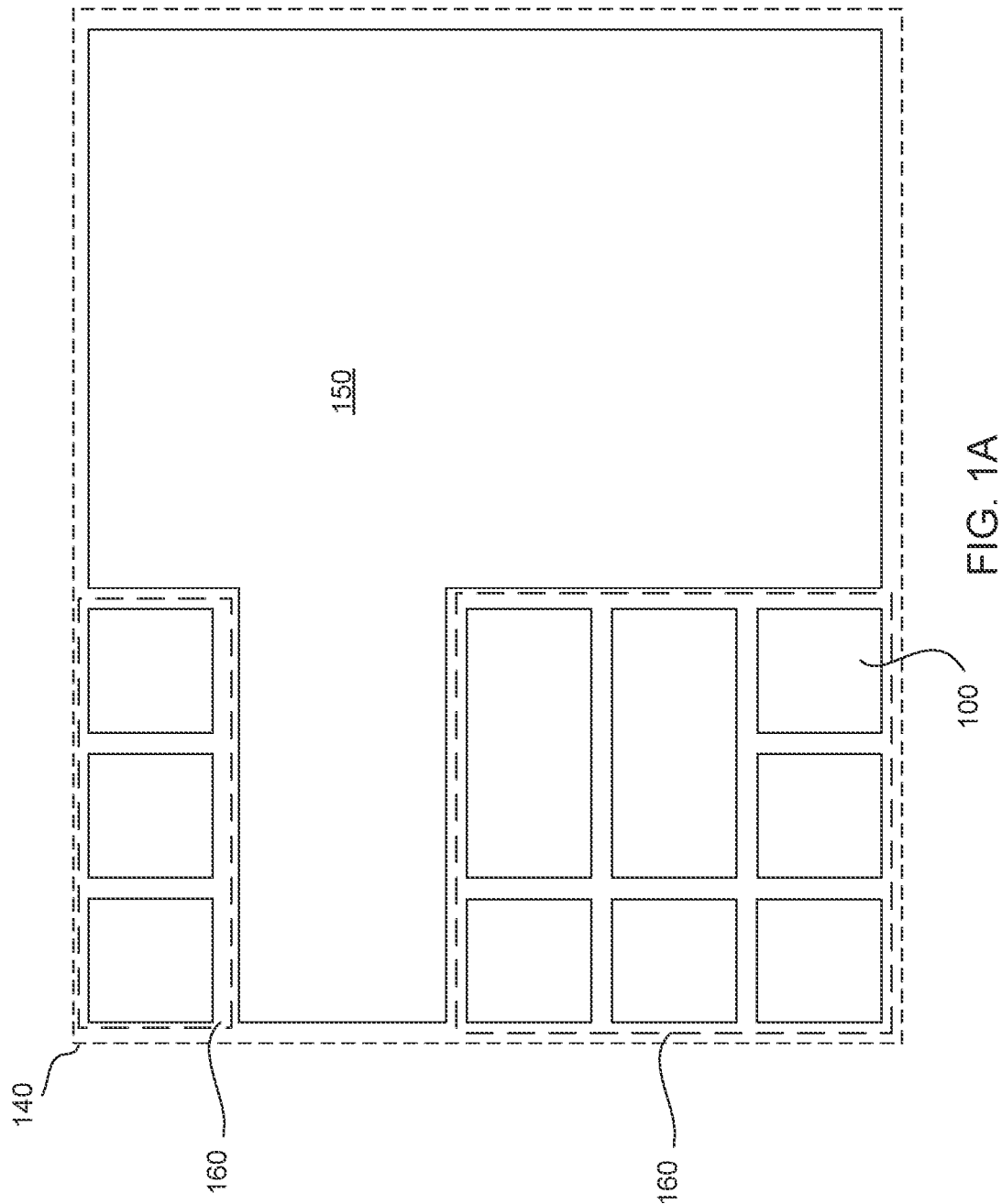

POWER SUPPLY TRACKING CIRCUITRY FOR EMBEDDED MEMORIES

RELATED APPLICATION

This application claims the benefit of U.S. provisional patent application Ser. No. 63/272,584, filed Oct. 27, 2021, which is incorporated herein by reference.

TECHNICAL FIELD

The present disclosure relates to embedded memory instances within an integrated circuit, and, in particular, control signals for within embedded memories having multiple power supply domains.

BACKGROUND

In some electronic systems, computer chips with integrated circuits may have embedded memory devices. In some instances, the memory device operates at one power supply voltage (e.g., power supply domain) for optimal performance, while control circuitry of the chip on which the memory device is embedded, operates at a different power supply voltage for optimal performance of other components of the chip. Memory devices that operate on a different voltage power supply than that of corresponding control circuitry present on the chip are referred to a dual rail, or dual supply, memory devices.

SUMMARY

In one example, a tracking circuitry includes an inverter, a level shifter, a delay circuitry, and a logic gate. The inverter receives a first clock signal and generates an inverted clock signal in a first power supply voltage domain. The level shifter receives the first clock signal and the inverted clock signal and generates a level shifted clock signal in a second power supply voltage domain. The delay circuitry receives the level shifted clock signal and generates an inverted level shifted clock signal. The logic gate has a first input that receives the first clock signal and a second input that receives the inverted level shifted clock signal. From these inputs, the logic gate generates a second clock signal based on the first clock signal and the inverted level shifted clock signal.

In another example, a memory device includes bitcells, memory core circuitry, and control circuitry. The bitcells operate in a first power supply voltage domain. The memory core circuitry is coupled to the bitcells and generates a control signal for the bitcells in the first power supply voltage domain, to write data to the bitcells. The control circuitry of the memory device is coupled to the memory core circuitry of the memory device. The control circuitry generates a data clock signal in a second power supply voltage domain that is different from the first power supply voltage domain. In addition, a rising edge of the data clock signal corresponds to the second power supply voltage domain, while a falling edge of the data clock signal corresponds to the first power supply voltage domain.

In another example, a memory device includes bitcells, memory core circuitry, and control circuitry. The bitcells operate in a first power supply voltage domain. The memory core circuitry is coupled to the bitcells and generates a control signal for the bitcells in the first power supply voltage domain, to write data to the bitcells. The control circuitry of the memory device is coupled to the memory core circuitry of the memory device. The control circuitry generates an address clock signal in a second power supply voltage domain that is different from the first power supply voltage domain. In addition, a rising edge of the address clock signal corresponds to the second power supply voltage domain, while a falling edge of the address clock signal corresponds to the first power supply voltage domain.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1A is an exemplary schematic block diagram of an integrated circuit chip, according to one or more examples.

DETAILED DESCRIPTION

Figure 1B:
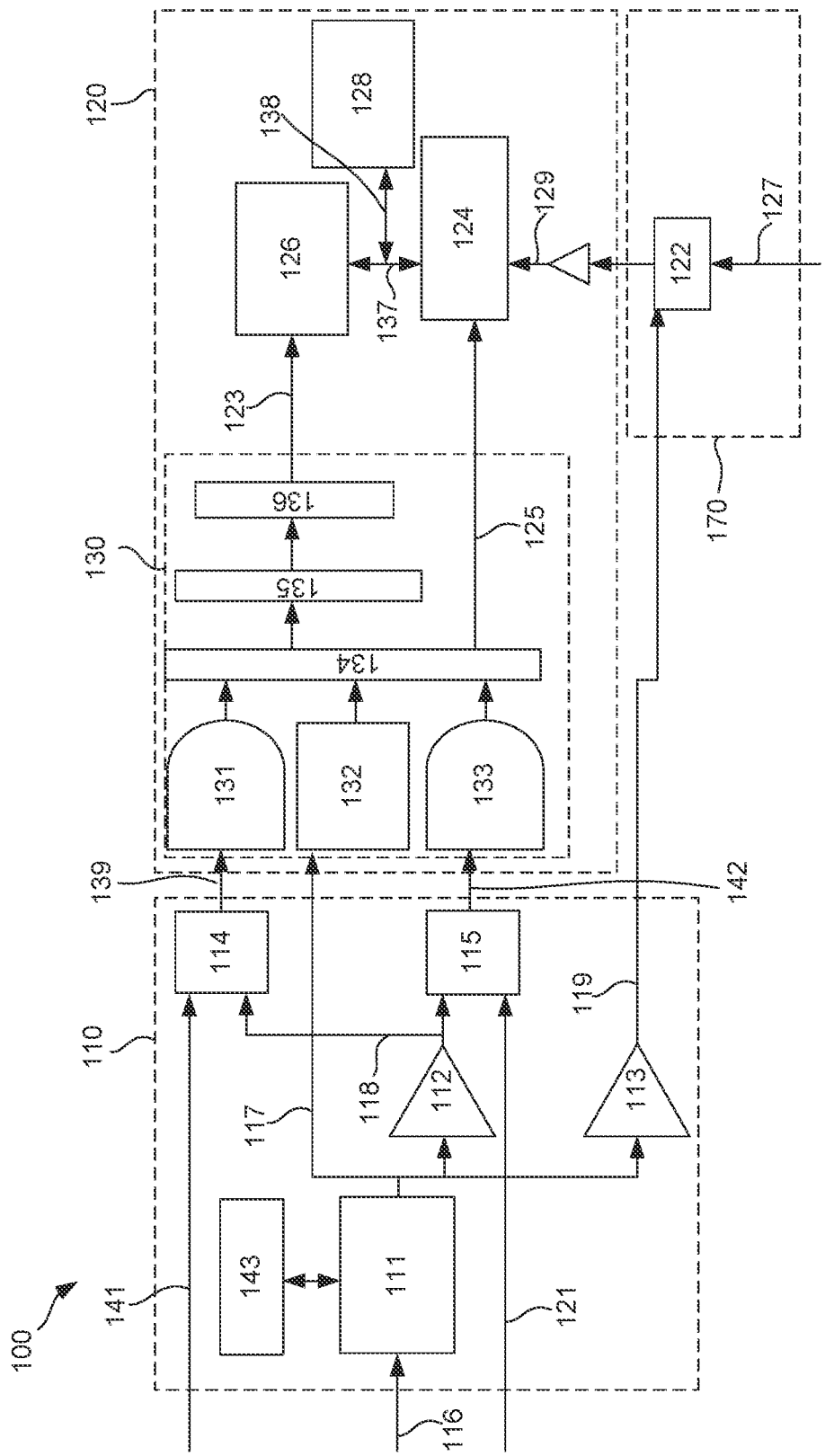
FIG. 1B illustrates exemplary components of a memory device for an integrated circuit chip, according to one or more examples.

Aspects of the present disclosure relate to power supply tracking circuitry for embedded dual-rail memories.

Computer chips with integrated circuits can include memory devices (e.g., memory instances), among other components. Each of the memory devices includes memory core circuitry and control circuitry to control read and write operations to and from the memory device. In some embodiments, memory arrays are composed of an array of bit cells, each of which stores 1 bit of data. Each bit cell may have two inputs—a wordline and a bitline. To write data into the memory, the wordline activates bit cells in a particular row of the bitcell array based on address information, while the bitline transfers bit data into that activated row of the bitcell array.

Static Random Access Memories (SRAMs) may utilize a pulsed wordline, where the wordline is activated for a small amount of time necessary to create a sufficient bitline differential voltage, after which it is turned off. This technique prevents the development of a bitline voltage differential that is greater than necessary, reducing the power dissipated during the precharge process for the bitline. The width of the pulsed wordline can be controlled using delays, where the wordline is turned off after a certain amount of predesigned delay using delay circuitry.

Control circuitry for this type of memory device may provide clock signals, row address signals, and column address signals, among others, to the memory core circuitry to update the corresponding bitcells. These control signals may arrive at the bitcell via the wordline input. The timing of these control signals for the wordline input to the bitcell need to align with the timing of the control signals for the bitline input, so that data can be written in the proper location of the bitcell at the proper time. If the bitline input is flowing while the wordline has not yet been activated, then the data will not get written to the bitcell and will be lost. If the bitline input is not flowing while the wordline has been activated, then cycle time is wasted, degrading performance of the memory and causing excess power generation on the chip.

In dual-rail systems with embedded memories, the control circuitry of the chip operates at a different voltage than the bitcell array. That is, control circuitry operates in a first power supply domain, while the bitcells operate in a second power supply domain. Operating the control circuitry at the lower power supply voltages reduces the amount of power used by components on the chip. In this example, signals provided to the bitcells from the control circuitry are shifted to the power supply voltage level of the bitcells.

However, as the bitcells and the control circuitry operate at different power supply voltages, signals provided to the bitcells from the control circuitry (via the wordline) do not arrive at the same time as signals provided. As such, the timings of the control signals to the wordline may not align with the timings of the control signals to the bitline of the bitcell array, causing data loss, data corruption, reduced performance of the memory, and/or excess power dissipation.

In some instances, a portion of the signals are shifted by the memory core circuitry to reduce the amount of power used by the memory device. In such examples, data write errors may occur due to timing differences of the signals used to write data to the bitcells. For example, data may be driven before the correct bit of the bitcells is selected, writing the wrong data to the bit.

A memory device is updated based on a data clock signal, a write signal, and a wordline signal. Data clock signal clocks a data latch of the memory device, write signal selects a column within the memory device for updating, and wordline signal selects a line within the memory device for updating. Data is written to a selected bit based on the rising and falling edges of the wordline. In an example where control circuitry operates at a lower power supply voltage than the bitcells, to reduce the amount of power used by the corresponding memory system, the data clock may be maintained at the power supply voltage level of the control circuitry, while the write signal and wordline signal are maintained at the power supply level of the bitcells. As data clock is at a different power supply voltage than that of the write signal, and/or the wordline signal, the falling edges of the data clock may be misaligned with those of write signal and wordline signal, introducing data write errors within the memory device.

In exemplary embodiments of the present disclosure, a tracking circuit is described that aligns the fallings edges of a data clock signal with those of the write signal and wordline signal for dual-rail systems, reducing data write errors within a memory devices. The tracking circuit adapts the rising and falling edge of clock signals within the control circuitry to be based on the power supply signal level of the control circuitry and the power supply signal level of the bitcells, respectively. Accordingly, the clock signals may be operated at the lower power supply voltage of the control circuitry, and aligned with the timing of the bitcells operated at the higher power supply voltage. Further, in instances where the power supply voltage of the bitcells is less than that of the control circuitry, to reduce the amount power used by the memory device, the clock signals of the driver chip are adjusted accordingly.

In various embodiments, the tracking circuit utilizes a level shifter, inverters, and a NOR gate to either delay or speed up a data clock signal in the control circuitry of a memory device operating at one power supply voltage that is different from the power supply voltage of the bitcells. This adjusted data clock signal allows the bitline signal generated in the first power supply voltage to align in timing with the write signal and wordline signal generated in the second power supply voltage.

Technical advantages of the present disclosure include, but are not limited to, providing one memory device that is capable of being embedded in an integrated circuit and can perform in an optimal manner regardless of the power supply voltages of the other components on the integrated circuit. That is, the memory device bitcells may operate at a same voltage, or a different voltage than logic circuitry of the integrated circuit, and still process and store data with minimal data loss or corruption, minimal power dissipation, and minimal cycle time gap.

FIG. 1A is a high level block diagram of an exemplary chip 140. The chip 140 of FIG. 1A includes logic circuitry 150 and memory devices 160, including memory device 100 which will be described further with respect to FIG. 1B. The memory devices 160 are embedded memory instances within the chip 140. While not depicted in the figure for simplicity, there are other components present on the chip 140 in exemplary embodiments.

In one example, the chip 140 is a System-on-Chip (SoC), and includes components normally found in a standard computer system. For example, a SoC may include components such as a CPU (Central Processing Unit), RAM (Random Access Memory), storage, I/O (input/output) ports, among others. In another example, the chip 140 may be another type of device.

The logic circuitry 150 of chip 140 operates in a first voltage domain (e.g., VDDP for voltage domain of periphery components). The memory devices 160 operate in the first voltage domain and/or a second voltage domain (e.g., VDDA for voltage domain of array components). In various embodiments, the voltage level of the second voltage domain may be less than, greater than, or equal to that of the first voltage domain.

In embodiments where the voltage levels of the first and second voltage domains differ, the memory devices 160 operate in a dual-supply mode. For example, as will be described with regard to FIG. 1B, the bitcells of a memory device may operate in a different voltage domain than the corresponding control circuitry of the memory device.

FIG. 1B illustrates exemplary components of a memory device 100, according to one or more examples. The memory device 100 can be any one of the memory devices 160 of FIG. 1A. The memory device 100 includes the control circuitry 110 and the memory core circuitry 120, also sometimes referred to as memory bank circuitry. Exemplary FIG. 1B also depicts global I/O 170, which provides data to the memory device 100 in various embodiments. While not explicitly depicted in the figure, there may also be other components present on memory device 100 in other embodiments.

The control circuitry 110 and global I/O 170 operate in the first voltage domain (VDDP). For example, the control circuitry 110 operates at the power supply voltage VDDP. With reference to the chip 140 of FIG. 1A, the control circuitry 110 operates in the voltage domain as the logic circuitry 150.

The control circuitry 110 includes clock generation circuit 111 that receives an external clock signal 116 and generates an internal memory clock signal 117 based on memory timer 143. The control circuitry 110 further includes a buffer 112, a buffer 113, latch 114, and a latch 115.

In exemplary embodiments, buffer 112 generates an address clock signal 118 from the internal memory clock signal 117, and outputs address clock signal 118 to the latch 114 and the latch 115. The address clock signal 118 provides clocking to determine timing of when the address control signals are sent to memory core circuitry 120.

Latch 114 receives a row address signal 141 and address clock signal 118 and outputs a row address control signal 139 to memory core circuitry 120. The row control signal determines where and when a particular row of a bitcell array in the memory is charged to allow data to be written to it. In exemplary embodiments, latch 114 can be any suitable type of latch, including, but not limited to, a broken-feedback transparent latch.

Latch 115 receives a column address signal 121 and address clock signal 118 and outputs a column address control signal 142 to memory core circuitry 120. The column control signal determines where and when a particular column of a bitcell array is charged to allow data to be written to it. In exemplary embodiments, latch 115 can be a same or a different type latch than latch 114.

Buffer 113 receives the internal memory clock signal 117 and generates a data clock signal 119. The data clock signal is used to capture and hold the incoming write data to write the bitcells of the memory in the memory core circuitry 120.

The control circuitry 110 of memory device 100 is connected to the memory core circuitry 120. As depicted in the exemplary figure, the control circuitry 110 outputs an internal memory clock signal 117, a row address control signal 139, and a column address control signal 142 to the memory core circuitry 120. Control circuitry 110 also generates a data clock signal 119 and outputs it to global I/O 170, which processes it and generates an output to the memory core circuitry 120. While not explicitly depicted in the figure, there may also be other control signals output from control circuitry 110 to memory core circuitry 120, either directly or indirectly.

The memory core circuitry 120 includes driver circuitry 130 that receives the internal memory clock signal 117, the row address control signal 139, and the column address control signal 142, and generates wordline signal 123 and write signal 125. The driver circuitry 130 includes row pre-decoder circuitry 131, wordline clock decoder circuitry 132, write column decoder circuitry 133, level shifter 134, row decoder circuitry 135, and wordline driver circuitry 136.

In one example, to reduce the amount of power used by the memory core circuitry 120, and the memory device 100, a first portion of the driver circuitry 130 is operated at VDDP (e.g., the power domain of the control circuitry 110 and the logic circuitry 150 of FIG. 1B) while a second portion of the driver circuitry 130 is operated at the VDDA (e.g., a power domain of the bitcells that may be different from the power domain of the control circuitry 110 and the logic circuitry 150 of FIG. 1B). In such examples, the voltage level of the power domain of the control circuitry 110 is different than that of the bitcells.

For example, the pre-decoder circuitry 131, the wordline clock decoder circuitry 132, the write column decoder circuitry 133 are operated at VDDP while the row decoder circuitry 135, and the wordline driver circuitry 136 are operated at VDDA. The level shifter 134 shifts the signals output by the pre-decoder circuitry 131, the wordline clock decoder circuitry 132, and the write column decoder circuitry 133 from the VDDP domain to VDDA. Accordingly, write signal 125 and wordline signal 123 are at VDDA.

Upon receipt of these control signal(s), memory core circuitry 120 selects a location and a data bit to be stored in the bitcell array for a write, read, or erase operation.

The memory core circuitry 120 further includes a column selection circuitry 124, bitcells 126, and precharge circuitry 128. The column selection circuitry 124 receives and selects a column for updating with the bitcells 126 based on write signal 125 and a data-word signal 129. The bitcells 126 receives wordline signal 123 which selects a line for updating within the bitcells 126. That is, wordline signal 123 is the signal that opens up the bitcell terminal(s) to allow data to be written into the bitcells. As write signal 125 and wordline signal 123 are at VDDA, the column selection circuitry 124 and the bitcells 126 are operated at VDDA. Accordingly, any differences in timings between VDDP and VDDA may result in data write errors within the bitcells 126.

Bitcells 126 may be composed of any number or configuration of bitcells to store data within memory device 100. In one exemplary embodiment, bitcells 126 is an array of 256×128 size. Upon receipt of the wordline signal 123 and the bitline signal 137, data can be written, read, and erased from bitcells 126.

Precharge circuitry 128 is composed of circuitry to precharge the bitline so it can switch from a low condition (0) to a high condition (1) at the end of the cycle. In exemplary embodiments, precharge circuitry 128 operates in the VDDP domain, so the bitline is also at VDDP voltage level.

Latch 122 receives data clock signal 119 from control circuitry 110 and a data signal 127 within global I/O 170. The data signal 127 contains data information that is to be written to the memory bitcells 126, and can come from any input or output device in communication with memory device 100. In various embodiments, latch 122 may be a same or different type latch than latch 114 and/or latch 115. Latch 122 captures the data signal 127 based on a rising edge of data clock signal 119. Accordingly, as data clock signal 119 is at VDDP, the latch 122 is operated at VDDP.

Figure 2:
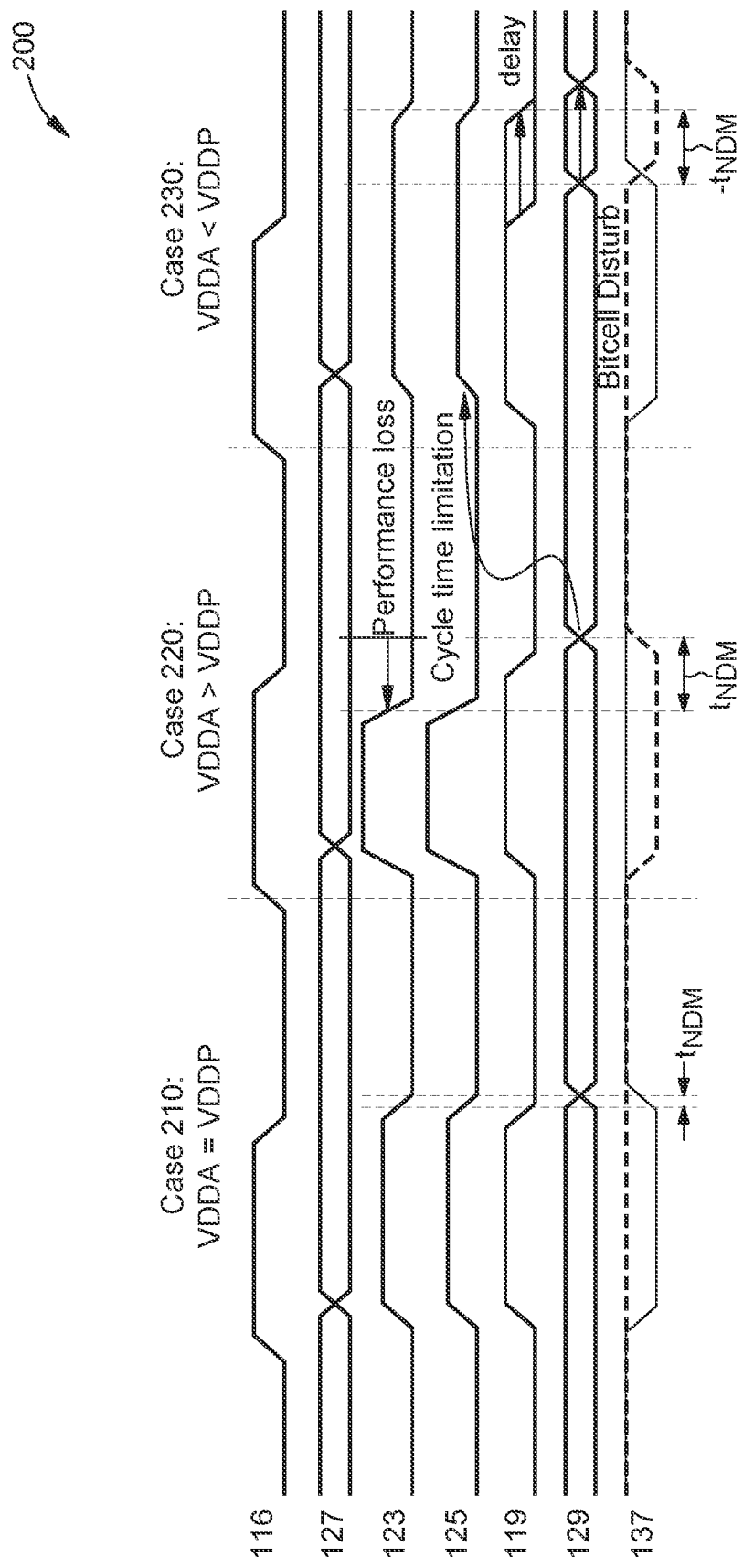
FIG. 2 illustrates an exemplary timing diagram for driving a memory device under various conditions, according to one or more examples.

FIG. 2 illustrates an exemplary timing diagram 200 for the circuit of FIG. 1B. Timing diagram 200 illustrates the timings of external clock signal 116, data signal 127, wordline signal 123, write signal 125, data clock signal 119, data-word signal 129, and bitline signal 137 in three different instances: case 210 where VDDA=VDDP, case 220 where VDDA>VDDP, and case 230 where VDDA<VDDP. In various examples, the memory device 100 supports each of the instances VDDA=VDDP, VDDA>VDDP, and VDDA<VDDP. In one example, when VDDA is greater than VDDP, VDDA is about 1 V and VDDP is about 0.6 V, causing a 400 mV forward split. In one example, when VDDA is less than VDDP, VDDA is about 0.7 V and VDDP is about 0.9 V, causing a 200 mV reverse split.

As can be seen from case 210 of the timing diagram 200, when the voltage level of VDDA equals that of VDDP (e.g., the instance VDDA=VDDP), there are no timing issues between the signals. That is, the data window for the bitcell bitline terminals (BT/BB) based on bitline signal 137 is aligned with the wordline signal 123. Thus, the two primary inputs for a bitcell are aligned in terms of timing, and have rising edges and falling edges that occur at the same time. As such incoming data should be able to write to the bitcells 126 without problems.

Furthermore, the timing diagram 200 shows that for case 210, the rising and falling edges of wordline signal 123, write signal 125, and data clock signal 119 are aligned. In one example, the falling edge of wordline signal 123 determines when writing to a selected bit of the bitcells 126 is completed. Thus, when the wordline closes, as shown by the falling edge of wordline signal 123, no further data is presented via the bitline signal 137 and thus no data loss should occur.

FIG. 2 depicts a variable $t_{NDM}$, which represents a new data margin time. This new data margin time shows the critical timing relationship that is present in memory device 100. By the time the wordline closes (wordline signal 123 transitions to a low value) and the write margin is completed (write signal 125 transitions to a low value), the bitcell pass gates have been closed. Thus, data on the bitline terminals can be changed without any effect on the data stored in the bitcells. Accordingly, the length of the new data margin time is long enough to allow wordline signal 123 to transition to a low level, closing the corresponding bit for writing before the next data signal 127 is received and written to the bitcells 126. For optimum power and performance of memory device 100, it is desired that $t_{NDM}$ be as low a value as possible.

Turning to exemplary case 230 of timing diagram 200, the voltage level of VDDA is less than that of VDDP (e.g., instance VDDA<VDDP). In this case, the wordline signal 123, because it is on the lower VDDA logic, does not go up as high and also extends farther to the right than it does in case 210 when the two voltage domains are equal.

At the same time, the bitline timings are controlled by the write data which has a data clock latch control on the VDDP domain. Because it is on the VDDP domain, data clock signal 119 gets sped up at the higher voltage, showing an inward adjustment on the timing diagram 200. Since data clock signal 119 is sped up, it allows new data to transition at the same time the wordline is still activated from the previous cycle. This changing of data will corrupt the bitcell.

In sum, the wordline signal 123 and write signal 125 (which are operating in the lower VDDA domain) are in a high state for a longer period of time than the data clock signal 119, data-word signal 129, and bitline signal 137 (which are all operating in the higher VDDP domain). This causes a misalignment in timings of signals coming to the bitcells via the wordline input and the bitline input. As such, the new data margin time is increased. That is, there is time where the wordline is activated but different data is coming in through the bitline to the bitcells because the bitline is being controlled by the data clock signal 119 latch. This limits the cycle time performance of memory device 100.

Turning to exemplary case 220 of timing diagram 200, the voltage level of VDDA is greater than that of VDDP (e.g., instance VDDA>VDDP). In this case, the signals on the higher VDDA voltage level, wordline signal 123 and write signal 125 are more intense and travel through the circuit faster. FIG. 2 shows these signals at a higher level than in case 210, and with a falling edge that occurs faster than in case 210. The signals on the lower VDDP voltage level, data clock signal 119, data-word signal 129, and bitline signal 137, travel through the memory circuitry slower. As such, the bitline timings (on the higher VDDP domain) are not aligned with the wordline timings (on the lower VDDA domain), leading to loss of performance of the memory device 100.

When the wordline has closed and the write window is completed, a new cycle can't begin until new data gets presented to the bitcell. So the new data margin time $t_{NDM}$ represents a delay in cycle time and loss of performance.

Further, in order to make a memory device 100 that is optimally functional for all three cases, a delay period is added to data clock signal 119 to align data clock signal 119 with write signal 125 and wordline signal 123 for case 230 and prevent corruption of the bitcell. For case 220 however, Due to the delay added to data clock signal 119, this makes data clock signal 119 even longer and the falling edge of data clock signal 119 occurs after the falling edge of wordline signal 123 and write signal 125, increasing the length of $t_{NDM}$. Accordingly, even though wordline signal 123 and write signal 125 have transitioned to a low value and are ready to write the next data signal, the memory device 100 is unable to write the next data signal until data clock signal 119 transitions to a low value. As such, this leads to further loss of cycle time and performance of memory device 100.

Figure 3:
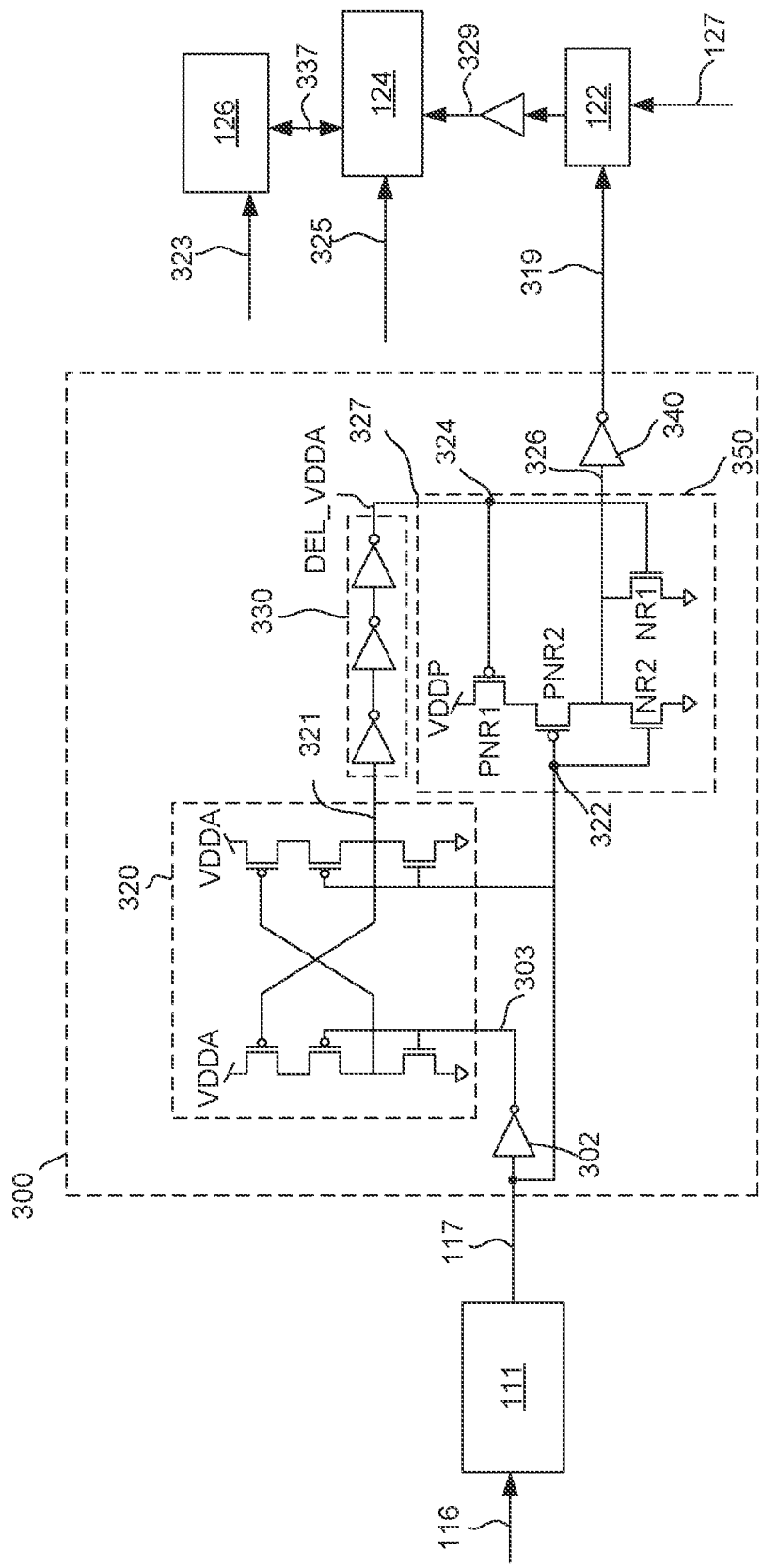
FIG. 3 illustrates an exemplary circuit diagram of tracking circuitry for a memory device, according to one or more examples.

FIG. 3 depicts exemplary tracking circuitry 300 for a memory device that aligns timings of the primary signals so that the timing of a wordline and bitline are aligned for a bitcell array, regardless of the respective voltages of the signals in the dual-rail memory. That is, both the wordline and bitline of a bitcell array transition to a high value or to a low value at the same time even though they are operating at different voltages.

The tracking circuitry 300 of FIG. 3 may be added to a buffer to align a data clock signal (such as data clock signal 119 of FIG. 1B) with a wordline signal (such as wordline signal 123 of FIG. 1B) and a write signal (such as write signal 125 of FIG. 1B) when VDDA is at a different voltage than VDDP, thus improving the performance of a memory device. For example, a memory device including such tracking circuitry is able to use less power when VDDA is less than VDDP, and provide a higher operating performance when VDDA is greater than VDDP.

In an exemplary embodiment, the tracking circuitry 300 is included within the buffer 113 and/or the buffer 112 of FIG. 1B. The tracking circuitry 300 receives an internal memory clock signal 117 generated by the clock generation circuit 111 from external clock signal 116, and based on VDDP voltage domain. Internal memory clock signal 117 is received by tracking circuitry 300 and inverted by inverter 302 into an inverted internal memory clock signal 303. The inverter 302 is also operated at VDDP voltage domain. The output of the inverter 302 is connected to the level shifter 320 that shifts the inverted internal memory clock signal 303 from VDDP to VDDA (e.g., between voltage domains). In the example of FIG. 3, VDDP corresponds to the power supply voltage of the control circuitry 110 of FIG. 1B, and the VDDA corresponds to the power supply voltage of the memory core circuitry 120 of FIG. 1B.

The output of level shifter 320 is a level shifted clock signal 321, which is output to the delay elements 330 operating at VDDA. The delay elements 330 include an odd number of inverting delay units. For example, the delay elements 330 includes 1, 3, 5, 7, or more inverting delay units, in various embodiments. The output of the delay elements is inverted level shifted clock signal 327 which is provided to an input 324 of the NOR gate 350. The input 322 of the NOR gate 350 receives internal memory clock signal 117. The output of the NOR gate 350 is inverted by inverter 340 to generate data clock signal 319. The NOR gate 350 and the inverter 340 operate at VDDP.

The NOR gate 350 includes transistors PNR1, PNR2, NR2 and NR1. In exemplary embodiments, the transistors PNR1 and PNR2 are PMOS transistors and the transistors NR2 and NR1 are NMOS transistors. However, in other examples, other types, numbers, and/or configurations of transistors may be used in NOR gate 350.

During operation of tracking circuitry 300, internal memory clock signal 117 transitions to a high level (e.g., a rising edge). Internal memory clock signal 117 is received by the NOR gate 350 at the input 322. As the input 322 has a high level, the output 326 of the NOR gate has a low value. The inverter 340 inverts the output 326 to a high value. Accordingly, data clock signal 319 has a rising edge based on internal memory clock signal 117 having a rising edge. The rising edge of data clock signal 319 is based on VDDP, as internal memory clock signal 117 is generated by the clock generation circuit 111 operating at VDDP.

When internal memory clock signal 117 transitions to a low level (e.g., a falling edge), the value at the input 322 to NOR gate 350 has a low level. The inverter 302 receives internal memory clock signal 117 and inverts it to generate inverted internal memory clock signal 303 having a high level. The level shifter 320 receives both internal memory clock signal 117 and inverted internal memory clock signal 303. Based on inverted internal memory clock signal 303 having a high level and internal memory clock signal 117 having a low level, the level shifter outputs a level shifted clock signal 321 that is modulated based on VDDA, and is at a high level. The delay elements 330 receive level shifted clock signal 321 having a high value and output an inverted level shifted clock signal 327 signal having a low level to the input 324 of the NOR gate 350. Based on the inputs 322 and 324 having a low level, the output 326 of the NOR gate 350 is a high value. As the output 326 does not transition to a low value until both inputs 322 and 324 have a low value, the voltage level of the output 326 is controlled by VDDA. The high value on the output 326 is inverted by the inverter 340 to generate a falling edge within data clock signal 319.

Thus, when external clock signal 116 goes high, it goes through NOR gate 350 to become low, then inverter 340 to become high again. Thus external clock signal 116 and data clock signal 319 are the same polarity, which is important since the rising edge of the data clock signal 319 is the one that is used for capturing the data input from data signal 127.

Further, on the falling edge of external clock signal 116, the clock generation includes a self-time delay that is proportional to the internal memory timings. This self-timing delay in essence generates a falling edge of the clock. So when internal memory clock signal 117 goes low, the delay path of the tracking circuitry 300 is utilized, because of NOR gate 350, so data clock signal 319 goes low.

In examples when VDDA is greater than VDDP, the delay of delay elements 330 is reduced, which in turn decreases the time from the falling edge of internal memory clock signal 117 to the falling edge of data clock signal 319. Similarly, in examples when VDDA is less than VDDP, the delay of delay elements 330 increases, which also increases the delay from internal memory clock signal 117 falling edge to data clock signal 319 falling edge. This increase in delay provides the necessary timing margins to meet advantageous $t_{NDM}$ requirements.

Further, based on the inputs 322 and 324 having low levels, the gates of the transistors PNR1, PNR2, NR2 and NR1 have a low level. Further, when VDDA is less than VDDP, the transistor PNR1 does not completely turn off as the gate potential is less than the source potential. In such an example, the transistor PNR2 is turned off. Accordingly, when VDDA is less than VDDP, the current path within the NOR gate 350 is turned off.

The tracking circuitry 300 generates the rising edge of data clock signal 319 based on VDDP and the falling edge of data clock signal 319 based on VDDA. Accordingly, the falling edge of data clock signal 319 is aligned with the falling edge of wordline signal 323 and write signal 325, which are in the VDDA power supply domain. Aligning data clock signal 319 with wordline signal 323 and write signal 325 reduces data write errors within the corresponding memory device 100. Further, control circuitry (e.g., the control circuitry 110 of FIG. 1B) including the tracking circuitry 300 is able to support the improved performance of bitcells operating at power supply voltages (e.g., VDDA) higher than the power supply voltage of the control circuitry, while also supporting bitcells that operate at lower power supply voltages to save power.

Figure 4:
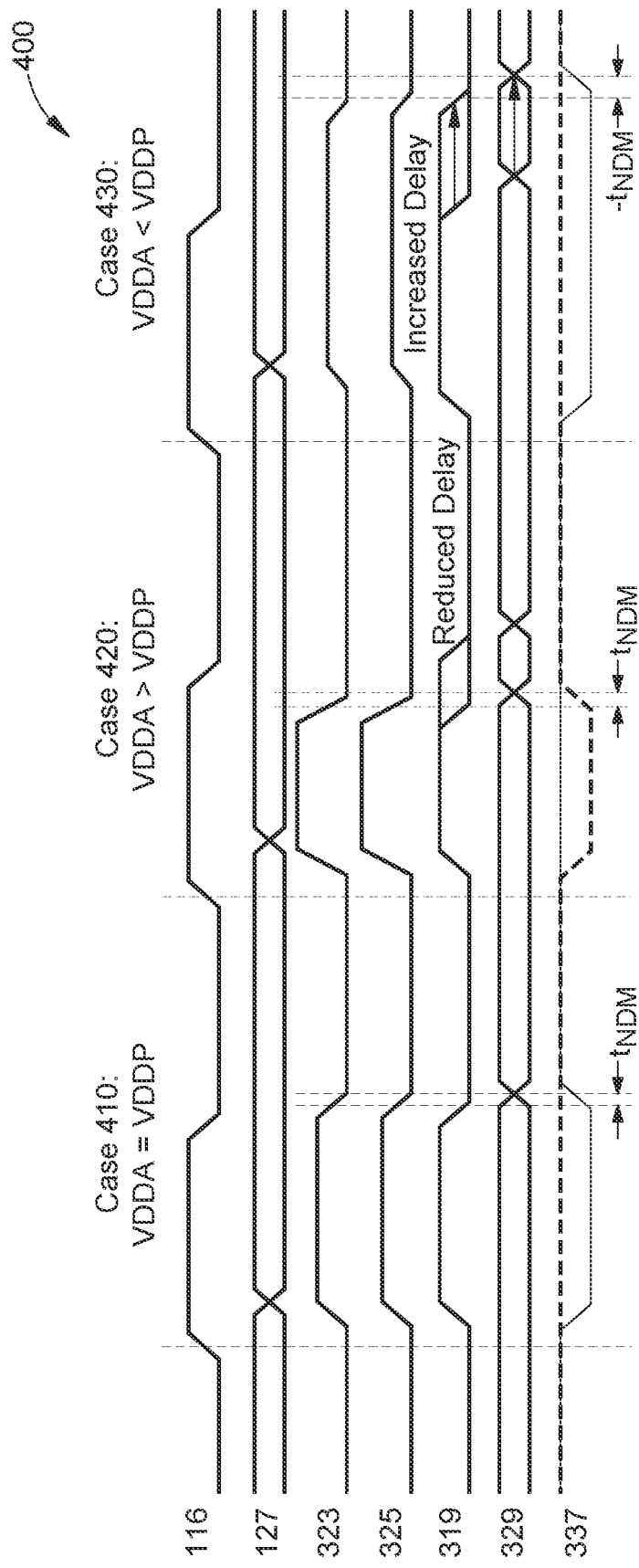
FIG. 4 illustrates an exemplary timing diagram for driving a memory device with tracking circuitry under various conditions, according to one or more examples.

FIG. 4 illustrates an exemplary timing diagram 400 for the tracking circuitry of FIG. 3. The timing diagram 400 is generated by a memory device including the tracking circuitry 300 of FIG. 3. Timing diagram 400 illustrates the timings of external clock signal 116, data signal 127, wordline signal 323, write signal 325, data clock signal 319, word signal 329, and bitline signal 337 from tracking circuitry 300 of FIG. 3 in three different instances. Case 410 represents the instance where VDDA=VDDP, case 420 represents the instance where VDDA>VDDP, and case 430 represents the instance where VDDA<VDDP. In various examples, the memory device 100 supports each of these three instances. In one example, when VDDA is greater than VDDP, VDDA is about 1 V and VDDP is about 0.6 V, causing a 400 mV forward split. In one example, when VDDA is less than VDDP, VDDA is about 0.7 V and VDDP is about 0.9 V, causing a 200 mV reverse split.

As can be seen from case 410 of the timing diagram 400, when the voltage level of VDDA equals that of VDDP (e.g., the instance VDDA=VDDP), there are no timing issues between the signals. That is, the data window for the bitcell bitline terminals (BT/BB) based on bitline signal 337 is aligned with the wordline signal 323. Thus, the two primary inputs for a bitcell are aligned in terms of timing, and have rising edges and falling edges that occur at the same time. As such incoming data should be able to write to the bitcells 126 without problems.

Furthermore, the timing diagram 400 shows that for case 410, the rising and falling edges of wordline signal 323, write signal 325, and data clock signal 319 are aligned. Thus, when the wordline closes, as shown by the falling edge of wordline signal 323, no further data is presented via the bitline signal 337 and thus no data loss should occur.

In addition, the new data time margin $t_{NDM}$ for case 410 of timing diagram 400 shows that the length of the new data margin time is long enough to allow wordline signal 323 to transition to a low level, closing the corresponding bit for writing before the next data signal 127 is received and written to the bitcells 126. For optimum power and performance of memory device 100, $t_{NDM}$ is as low a value as possible.

Turning to exemplary case 430 of timing diagram 400, the voltage level of VDDA is less than that of VDDP. In this case also, because of the delay elements added to tracking circuitry 300, the falling edge of wordline signal 323 is more in line with the falling edge of write signal 325, data clock signal 319, word signal 329, and bitline signal 337. As such, even though the new data margin time is a little higher than for case 410, it is still a much lower value than that shown in timing diagram 200 where no tracking circuitry is utilized. As such, use of the tracking circuitry reduces the delay in cycle time and improves the performance of memory device when VDDA is less than VDDP.

Turning to exemplary case 420 of timing diagram 400, the voltage level of VDDA is greater than that of VDDP. In this case also, there is a reduced delay because of tracking circuitry 300, so the falling edge of wordline signal 323 is more in line with the falling edge of write signal 325, data clock signal 319, word signal 329, and bitline signal 337. As such, the new data margin time for case 420 is reduced compared to that shown in timing diagram 200 where no tracking circuitry is utilized. Therefore, use of the tracking circuitry 300 reduces the delay in cycle time and improves the performance of the memory device when VDDA is greater than VDDP.

Figure 5:
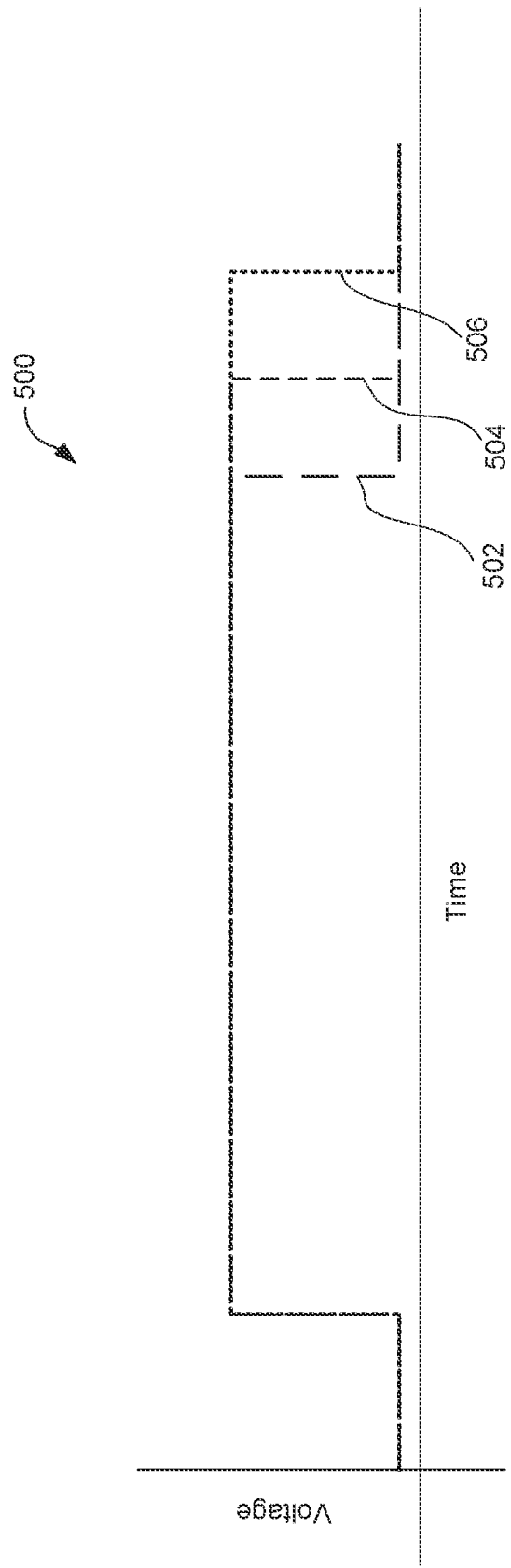
FIG. 5 illustrates an exemplary graph of data clock signals with different timings, according to one or more examples.

FIG. 5 illustrates a graph 500 illustrating three different data clock signals 502, 504, and 506 with different timings, depending on the difference between VDDA and VDDP. Data clock signal 502 corresponds to VDDA being greater than VDDP, data clock signal 504 corresponds to VDDA being equal to VDDP, and data clock signal 506 corresponds to VDDA being less than VDDP. Each of these data clock signals are generated from operation of tracking circuitry 300 of FIG. 3.

The rising edge of each of the data clock signals 502, 504, and 506 is the same, as can be seen from the left side of graph 500. That is, the rising edge of each of data clock signals 502, 504, and 506 occur at the same time and thus appear as simply one line on the graph 500. This is the optimal result for alignment of the rising edges of signals for optimal performance of tracking circuitry 300 in memory device 100. That is, the setup and hold constraints of the data clock are preserved regardless of the change in VDDA, which is a critical requirement for memory device 100.

Further, on the falling edge, a desired delay of data clock signal is achieved by shifting the data clock signal 506 to the right when VDDA<VDDP to track with the wordline timing. Similarly, on the falling edge, the data clock signal 502 is sped up (to the left of the graph) when VDDA>VDDP to track with the wordline timing.

Figure 6:
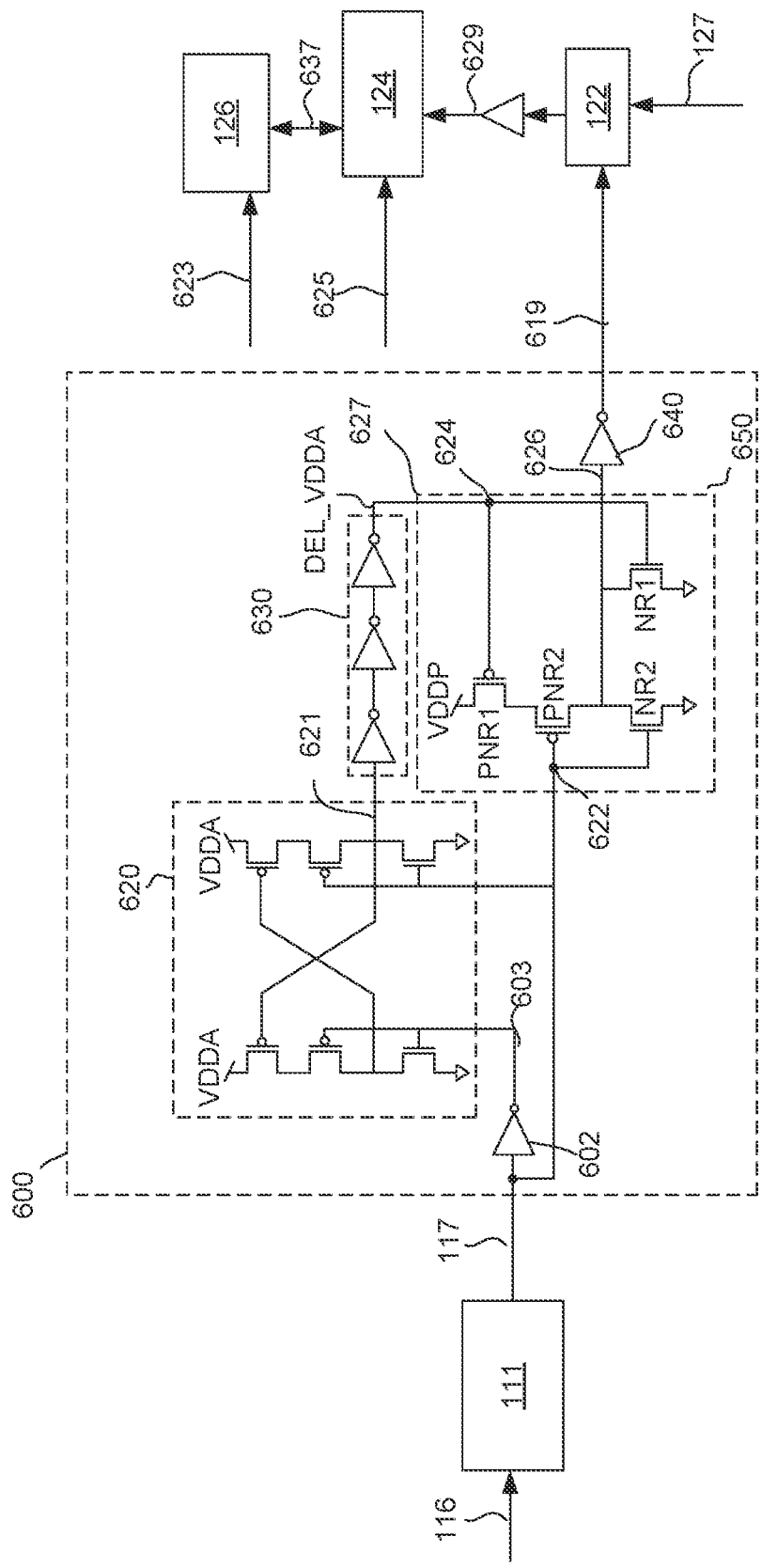
FIG. 6 illustrates another exemplary circuit diagram of tracking circuity for a memory device, according to one or more examples.

FIG. 6 depicts exemplary tracking circuitry 600 for a memory device that aligns timings of the primary signals so that the timing of a wordline and bitline are aligned for a bitcell array, regardless of the respective voltages of the signals in the dual-rail memory. That is, both the wordline and bitline of a bitcell array transition to a high value or to a low value at the same time even though they are operating at different voltages.

The tracking circuitry 600 of FIG. 6 may be added to a buffer to align an address clock signal (such as address clock signal 118 of FIG. 1B) with a wordline signal (such as wordline signal 123 of FIG. 1B) and a write signal (such as write signal 125 of FIG. 1B) when VDDA is at a different voltage than VDDP, thus improving the performance of a memory device. For example, a memory device including such tracking circuitry is able to use less power when VDDA is less than VDDP, and provide a higher operating performance when VDDA is greater than VDDP. In exemplary embodiments, memory device 100 includes both tracking circuitry 600 in one buffer (such as buffer 112 of FIG. 1B) and tracking circuitry 300 of FIG. 3 in a buffer (such as buffer 113 of FIG. 1B). In other embodiments, memory device 100 may include one of either tracking circuitry 600 of FIG. 6 or tracking circuitry 300 of FIG. 3 in either buffer.

Similar to FIG. 3, tracking circuitry 600 receives an internal memory clock signal 117 generated by the clock generation circuit 111 from external clock signal 116, and based on VDDP voltage domain. Internal memory clock signal 117 is received by tracking circuitry 600 and inverted by inverter 602 into an inverted internal memory clock signal 603. The inverter 602 is also operated at VDDP voltage domain. The output of the inverter 602 is connected to the level shifter 620 that shifts the inverted internal memory clock signal 603 from VDDP to VDDA (e.g., between voltage domains). In the example of FIG. 6, VDDP corresponds to the power supply voltage of the control circuitry 110 of FIG. 1B, and the VDDA corresponds to the power supply voltage of the memory core circuitry 120 of FIG. 1B.

The output of level shifter 620 is a level shifted clock signal 621, which is output to the delay elements 630 operating at VDDA. The delay elements 630 include an odd number of inverting delay units. For example, the delay elements 630 includes 1, 3, 5, 7, or more inverting delay units, in various embodiments. The output of the delay elements is inverted level shifted clock signal 627 which is provided to an input 624 of the NOR gate 650. The input 622 of the NOR gate 650 receives internal memory clock signal 117. The output of the NOR gate 650 is inverted by inverter 640 to generate address clock signal 619. The NOR gate 650 and the inverter 640 operate at VDDP.

The NOR gate 650 includes transistors PNR1, PNR2, NR2 and NR1. In exemplary embodiments, the transistors PNR1 and PNR2 are PMOS transistors and the transistors NR2 and NR1 are NMOS transistors. However, in other examples, other types, numbers, and/or configurations of transistors may be used in NOR gate 650.

During operation of tracking circuitry 600, internal memory clock signal 117 transitions to a high level (e.g., a rising edge). Internal memory clock signal 117 is received by the NOR gate 650 at the input 622. As the input 622 has a high level, the output 626 of the NOR gate has a low value. The inverter 640 inverts the output 626 to a high value. Accordingly, address clock signal 619 has a rising edge based on internal memory clock signal 117 having a rising edge. The rising edge of address clock signal 619 is based on VDDP, as internal memory clock signal 117 is generated by the clock generation circuit 111 operating at VDDP.

When internal memory clock signal 117 transitions to a low level (e.g., a falling edge), the value at the input 622 to NOR gate 650 has a low level. The inverter 602 receives internal memory clock signal 117 and inverts it to generate inverted internal memory clock signal 603 having a high level. The level shifter 620 receives both internal memory clock signal 117 and inverted internal memory clock signal 603. Based on inverted internal memory clock signal 603 having a high level and internal memory clock signal 117 having a low level, the level shifter outputs a level shifted clock signal 621 that is modulated based on VDDA, and is at a high level. The delay elements 630 receive level shifted clock signal 621 having a high value and output an inverted level shifted clock signal 627 signal having a low level to the input 624 of the NOR gate 650. Based on the inputs 622 and 624 having a low level, the output 626 of the NOR gate 650 is a high value. As the output 626 does not transition to a low value until both inputs 622 and 624 have a low value, the voltage level of the output 626 is controlled by VDDA. The high value on the output 626 is inverted by the inverter 640 to generate a falling edge within address clock signal 619.

In examples when VDDA is greater than VDDP, the delay of delay elements 630 is reduced, which in turn decreases the time from the falling edge of internal memory clock signal 117 to the falling edge of address clock signal 619. Similarly, in examples when VDDA is less than VDDP, the delay of delay elements 630 increases, which also increases the delay from internal memory clock signal 117 falling edge to address clock signal 619 falling edge. This increase in delay provides the necessary timing margins to meet advantageous $t_{NDM}$ requirements, given the setup and hold constraints of the clock.

Further, based on the inputs 622 and 624 having low levels, the gates of the transistors PNR1, PNR2, NR2 and NR1 have a low level. Further, when VDDA is less than VDDP, the transistor PNR1 does not completely turn off as the gate potential is less than the source potential. In such an example, the transistor PNR2 is turned off. Accordingly, when VDDA is less than VDDP, the current path within the NOR gate 650 is turned off.

The tracking circuitry 600 generates the rising edge of address clock signal 619 based on VDDP and the falling edge of address clock signal 619 based on VDDA. Accordingly, the falling edge of address clock signal 619 is aligned with the falling edge of wordline signal 623 and write signal 625, which are in the VDDA power supply domain. Aligning address clock signal 619 with wordline signal 623 and write signal 625 reduces data write errors within the corresponding memory device 100. Further, control circuitry (e.g., the control circuitry 110 of FIG. 1B) including the tracking circuitry 600 is able to support the improved performance of bitcells operating at power supply voltages (e.g., VDDA) higher than the power supply voltage of the control circuitry, while also supporting bitcells that operate at lower power supply voltages to save power.

Figure 7:
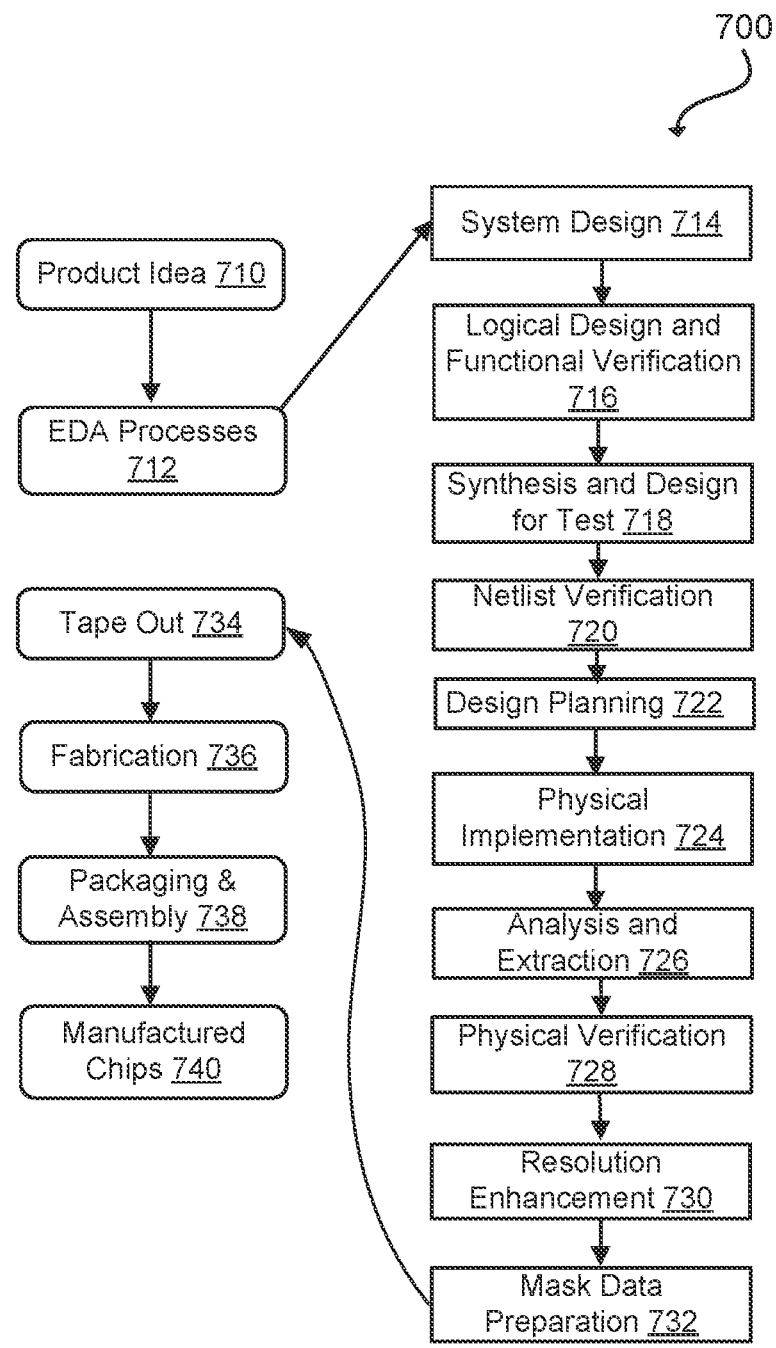
FIG. 7 depicts a flowchart of various processes used during the design and manufacture of an integrated circuit in accordance with some embodiments of the present disclosure.

While not expressly depicted in the figures, a tracking circuitry similar to tracking circuitry 300 of FIG. 3 and tracking circuitry 600 of FIG. 6 may also be utilized in precharge circuitry (such as precharge circuitry 128 of FIG. 1B) to precharge a bitline input to bitcells 126, FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 9, or host system 807 of FIG. 8) may be used to store the programs and data structures that are used by some or all of the EDA products described herein, and products used for development of cells for the library and for physical and logical design that use the library.

Figure 8:
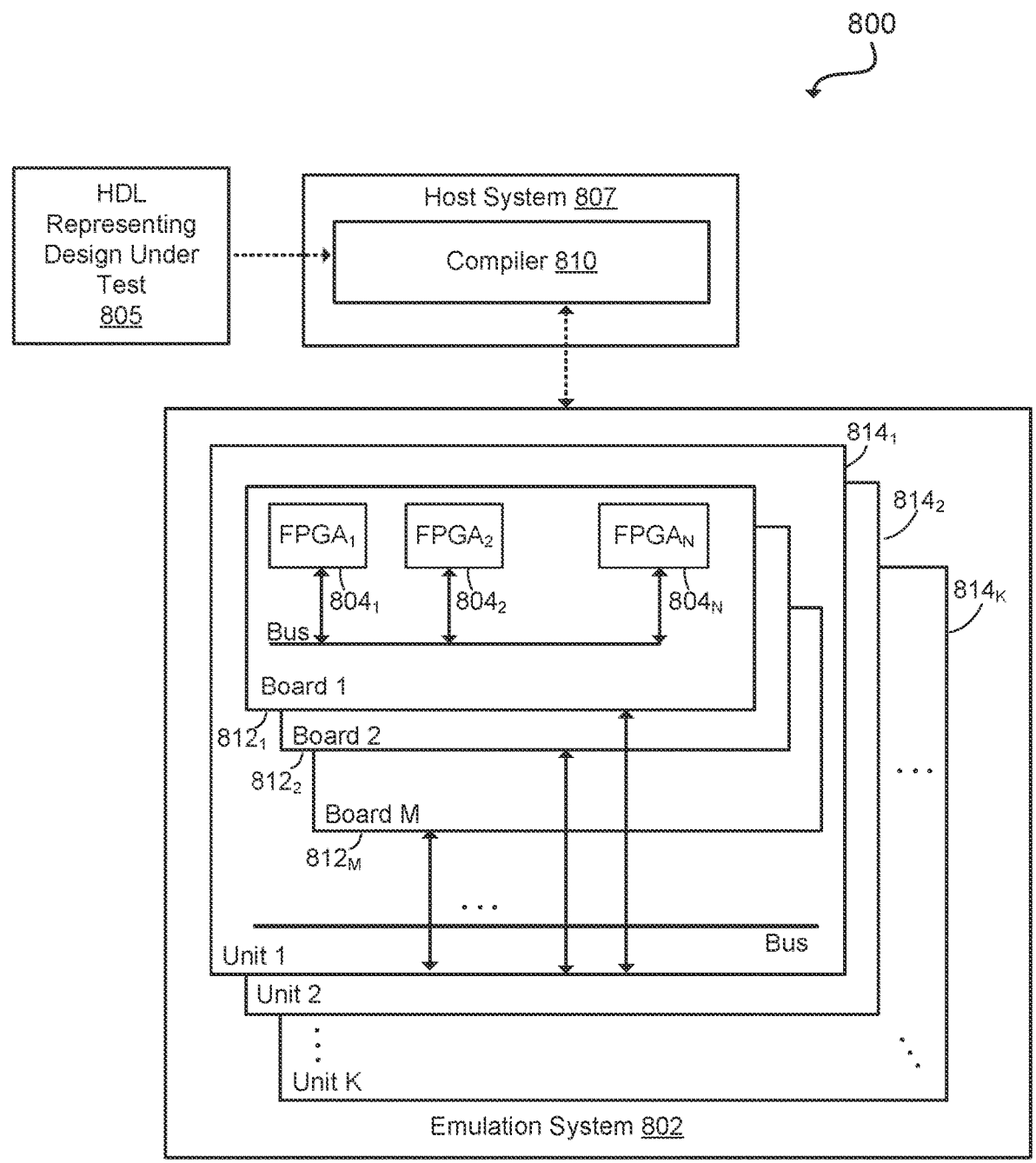
FIG. 8 depicts a diagram of an example emulation system in accordance with some embodiments of the present disclosure.

FIG. 8 depicts a diagram of an example emulation environment 800. An emulation environment 800 may be configured to verify the functionality of the circuit design. The emulation environment 800 may include a host system 807 (e.g., a computer that is part of an EDA system) and an emulation system 802 (e.g., a set of programmable devices such as Field Programmable Gate Arrays (FPGAs) or processors). The host system generates data and information by using a compiler 810 to structure the emulation system to emulate a circuit design. A circuit design to be emulated is also referred to as a Design Under Test ('DUT') where data and information from the emulation are used to verify the functionality of the DUT.

The host system 807 may include one or more processors. In the embodiment where the host system includes multiple processors, the functions described herein as being performed by the host system can be distributed among the multiple processors. The host system 807 may include a compiler 810 to transform specifications written in a description language that represents a DUT and to produce data (e.g., binary data) and information that is used to structure the emulation system 802 to emulate the DUT. The compiler 810 can transform, change, restructure, add new functions to, and/or control the timing of the DUT.

The host system 807 and emulation system 802 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 807 and emulation system 802 can exchange data and information through a third device such as a network server.

The emulation system 802 includes multiple FPGAs (or other modules) such as FPGAs $804_1$ and $804_2$ as well as additional FPGAs to $804_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 802 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $804_1$-$804_N$ may be placed onto one or more boards $812_1$ and $812_2$ as well as additional boards through $812_M$. Multiple boards can be placed into an emulation unit $814_1$. The boards within an emulation unit can be connected using the backplane of the emulation unit or any other types of connections. In addition, multiple emulation units (e.g., $814_1$ and $814_2$ through $814_K$) can be connected to each other by cables or any other means to form a multi-emulation unit system.

For a DUT that is to be emulated, the host system 807 transmits one or more bit files to the emulation system 802. The bit files may specify a description of the DUT and may further specify partitions of the DUT created by the host system 807 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 807 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 807 and/or the compiler 810 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 805 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A tracking circuitry comprising:
    an inverter configured to receive a first clock signal and generate an inverted clock signal in a first power supply voltage domain;
    a level shifter configured to receive the first clock signal and the inverted clock signal and generate a level shifted clock signal in a second power supply voltage domain different from the first power supply voltage domain;
    delay circuitry configured to receive the level shifted clock signal and generate an inverted level shifted clock signal; and
    a logic gate comprising a first input configured to receive the first clock signal and a second input configured to receive the inverted level shifted clock signal, wherein the logic gate is configured to generate a second clock signal based on the first clock signal and the inverted level shifted clock signal.

2. The tracking circuitry of claim 1, wherein the logic gate is a NOR gate.

3. The tracking circuitry of claim 1, wherein a rising edge of the second clock signal corresponds to the first power supply voltage domain and a falling edge of the second clock signal corresponds to the second power supply voltage domain.

4. The tracking circuitry of claim 1, wherein the logic gate comprises a first transistor having a gate coupled to the first input and a second transistor having a gate coupled to the second input and a source coupled to a drain of the first transistor, wherein the first transistor blocks current flow from the second transistor when a voltage value of the first input is a low voltage level.

5. The tracking circuitry of claim 1, wherein the inverted clock signal is used by a data latch to generate a bitline input to a bitcell of a memory device.

6. The tracking circuitry of claim 1, wherein the inverted clock signal is used by a bitline precharge latch to precharge a bitline input path to a bitcell.

7. The tracking circuitry of claim 1, wherein the inverted clock signal is used by an address signal latch to generate a wordline input to a bitcell of a memory device.

8. The tracking circuitry of claim 1, wherein the delay circuitry comprises an odd number of inverters.

9. A memory device comprising:
    bitcells configured to operate in a first power supply voltage domain;
    a memory core circuitry coupled to the bitcells and configured to generate a control signal in the first power supply voltage domain to write data to the bitcells; and
    a control circuitry coupled to the memory core circuitry, the control circuitry configured to generate a data clock signal in a second power supply voltage domain different than the first power supply voltage domain, wherein a rising edge of the data clock signal corresponds to the second power supply voltage domain and a falling edge of the data clock signal correspond to the first power supply voltage domain.

10. The memory device of claim 9, wherein the data clock signal generated by the control circuitry is used by the memory core circuitry to generate a bitline input to the bitcells.

11. The memory device of claim 9, wherein a wordline input to the bitcells operates in the first power supply voltage domain and a bitline input to the bitcells operates in the second power supply voltage domain.

12. The memory device of claim 9, wherein the first power supply voltage domain is higher than the second power supply voltage domain.

13. The memory device of claim 9, wherein the first power supply voltage domain is lower than the second power supply voltage domain.

14. The memory device of claim 9, wherein the control circuitry is further configured to generate an address clock signal in the second power supply voltage domain.

15. The memory device of claim 9, wherein the control circuitry generates the data clock signal in the second power supply voltage domain via a tracking circuitry in a buffer of the control circuitry.

16. A memory device comprising:
bitcells configured to operate in a first power supply voltage domain;
a memory core circuitry coupled to the bitcells and configured to generate a control signal in the first power supply voltage domain to write data to the bitcells; and
a control circuitry coupled to the memory core circuitry, the control circuitry configured to generate an address clock signal in a second power supply voltage domain different than the first power supply voltage domain, wherein a rising edge of the address clock signal corresponds to the second power supply voltage domain and a falling edge of the address clock signal correspond to the first power supply voltage domain.

17. The memory device of claim 16, wherein the address clock signal generated by the control circuitry is used by the memory core circuitry to generate a wordline input to the bitcells.

18. The memory device of claim 16, wherein a wordline input to the bitcells operates in the first power supply voltage domain and a bitline input to the bitcells operates in the second power supply voltage domain.

19. The memory device of claim 16, wherein the control circuitry generates the address clock signal in the second power supply voltage domain via a tracking circuitry in a buffer of the control circuitry.

20. The memory device of claim 16, wherein the first power supply voltage domain is less than the second power supply voltage domain.

\* \* \* \* \*